United States Patent
Matoy et al.

(10) Patent No.: US 9,728,480 B2
(45) Date of Patent: Aug. 8, 2017

(54) PASSIVATION LAYER AND METHOD OF MAKING A PASSIVATION LAYER

(71) Applicant: Infineon Technologies AG, Neubiberg (DE)

(72) Inventors: Kurt Matoy, Villach (AT); Hubert Maier, Villach (AT); Christian Krenn, Klagenfurt-Viktring (AT); Elfriede Kraxner Wellenzohn, Villach (AT); Helmut Schoenherr, Villach (AT); Juergen Steinbrenner, Noetsch (AT); Markus Kahn, Rangersdorf (AT); Silvana Fister, Poggersdorf (AT); Christoph Brunner, Villach (AT); Herbert Gietler, Villach (AT); Uwe Hoeckele, Regensburg (DE)

(73) Assignee: Infineon Technologies AG, Neubiberg (DE)

(*) Notice: Subject to any disclaimer, the term of this patent is extended or adjusted under 35 U.S.C. 154(b) by 0 days.

(21) Appl. No.: 14/699,704

(22) Filed: Apr. 29, 2015

(65) Prior Publication Data

US 2015/0235917 A1    Aug. 20, 2015

Related U.S. Application Data

(62) Division of application No. 13/664,311, filed on Oct. 30, 2012.

(51) Int. Cl.
*H01L 21/3105* (2006.01)
*H01L 23/31* (2006.01)
(Continued)

(52) U.S. Cl.
CPC ...... *H01L 23/3171* (2013.01); *H01L 21/0206* (2013.01); *H01L 21/0214* (2013.01);
(Continued)

(58) Field of Classification Search
USPC ............ 257/639, E21.24, E29.001; 438/763
See application file for complete search history.

(56) References Cited

U.S. PATENT DOCUMENTS 5,587,344 A * 12/1996 Ishikawa ............. H01L 21/3145
257/E21.269
6,078,072 A * 6/2000 Okudaira .......... H01L 27/10852
257/295

(Continued)

FOREIGN PATENT DOCUMENTS

CN    1614754 A  *  5/2005 ........... H01L 21/314

OTHER PUBLICATIONS

Machine translation, Wang, CN 1614754A, translation date: Jun. 5, 2015, Google Translate, all pages.*

(Continued)

*Primary Examiner* — Victoria K Hall
(74) *Attorney, Agent, or Firm* — Slater Matsil, LLP

(57) ABSTRACT

A passivation layer and a method of making a passivation layer are disclosed. In one embodiment the method for manufacturing a passivation layer includes depositing a first silicon based dielectric layer on a workpiece, the first silicon based dielectric layer comprising nitrogen, and depositing in-situ a second silicon based dielectric layer on the first silicon based dielectric layer, the second dielectric layer comprising oxygen.

18 Claims, 6 Drawing Sheets

(51) Int. Cl.
  *H01L 21/02*   (2006.01)
  *H01L 23/29*   (2006.01)
(52) U.S. Cl.
  CPC .... *H01L 21/0234* (2013.01); *H01L 21/02164* (2013.01); *H01L 21/02334* (2013.01); *H01L 23/291* (2013.01)

(56) References Cited

U.S. PATENT DOCUMENTS

| | | | |
|---|---|---|---|
| 8,076,250 B1 | 12/2011 | Rajagopalan et al. | |
| 9,207,504 B2* | 12/2015 | Kimura | G02F 1/134363 |
| 9,318,053 B2* | 4/2016 | Umezaki | G09G 3/3266 |
| 9,496,404 B2* | 11/2016 | Yamazaki | H01L 21/02554 |
| 2001/0016428 A1 | 8/2001 | Smith et al. | |
| 2001/0046791 A1* | 11/2001 | Subramanian | H01L 21/32139 438/786 |
| 2004/0171275 A1* | 9/2004 | Kwon | H01L 21/0276 438/725 |
| 2004/0253388 A1 | 12/2004 | Kim | |
| 2005/0230831 A1 | 10/2005 | Clevenger et al. | |
| 2005/0287688 A1* | 12/2005 | Won | C23C 16/345 438/22 |
| 2007/0029626 A1 | 2/2007 | Sakama et al. | |
| 2008/0224157 A1 | 9/2008 | Slater | |
| 2009/0267068 A1* | 10/2009 | Dairiki | H01J 37/32091 257/57 |
| 2010/0001346 A1* | 1/2010 | Ye | 257/347 |
| 2010/0099267 A1 | 4/2010 | Wang et al. | |
| 2010/0124618 A1* | 5/2010 | Kobayashi et al. | 427/535 |
| 2011/0042702 A1 | 2/2011 | Lim et al. | |
| 2011/0127518 A1* | 6/2011 | Jung | H01L 29/7869 257/43 |
| 2011/0151142 A1* | 6/2011 | Seamons | C23C 16/45523 427/579 |
| 2012/0068344 A1* | 3/2012 | Bonilla | H01L 21/28562 257/752 |

OTHER PUBLICATIONS

Belkind, A., et al., "Plasma Cleaning of Surfaces," Vacuum Technology & Coating, Nov. 2008, 11 pgs.

Kim, H., et al., "Wafer surface cleaning for silicon homoepitaxy with and without ECR hydrogen plasma exposure," Sep. 1994, Massachusetts Institute of Technology, 144 pgs.

Tendero, C., et al., "Atmospheric pressure plasmas: A review," Spectrochimica Acta Part B: Atomic Spectroscopy, vol. 61, Issue 1, Elsevier, Oct. 5, 2005, 29 pgs.

* cited by examiner

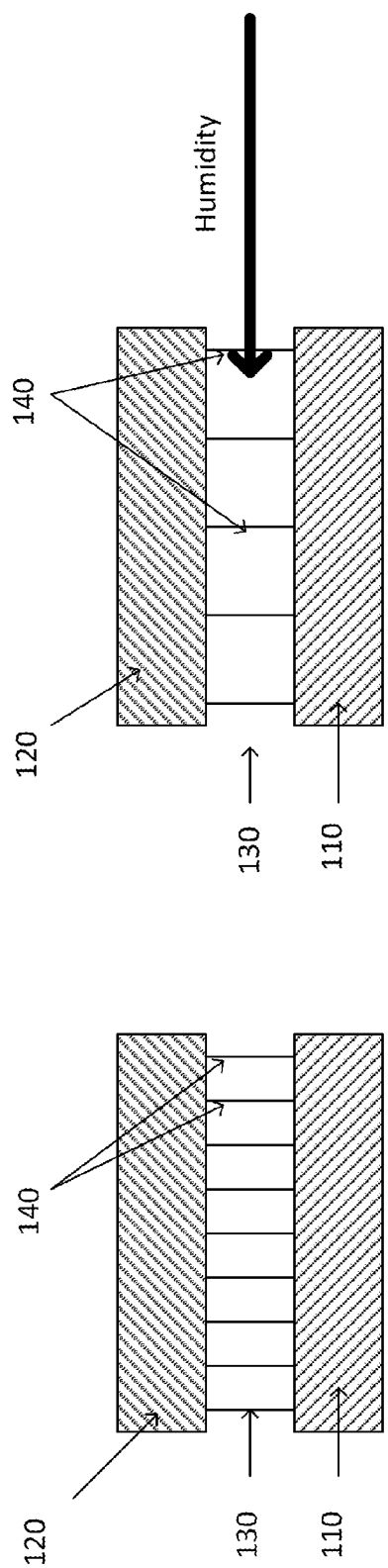
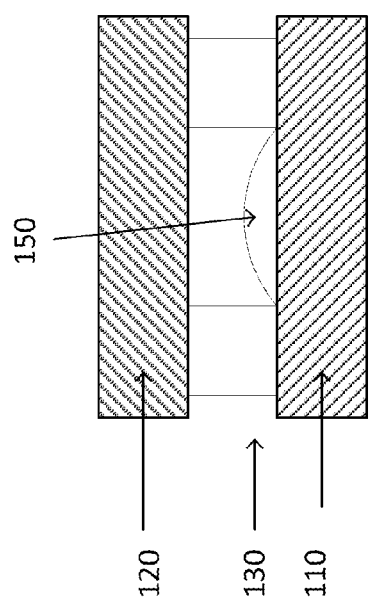
FIG. 1a
FIG. 1b
FIG. 1c

PASSIVATION LAYER AND METHOD OF MAKING A PASSIVATION LAYER

This application is a divisional of U.S. Non-Provisional application Ser. No. 13/664,311, filed on Oct. 30, 2012, now abandoned, which application is hereby incorporated herein by reference.

TECHNICAL FIELD

The present invention relates generally to a layer stack and method for making a layer stack, and, in particular embodiments, to a passivation layer and method for making a passivation layer.

BACKGROUND

Forming a passivation layer on a semiconductor chip or substrate protects the semiconductor chip or substrate from environmental factors and influences. For example, a passivation layer may shield the substrate or semiconductor chip from air or water.

SUMMARY

In accordance with an embodiment of the present invention, a method for manufacturing a passivation layer comprises depositing a first silicon based dielectric layer on a workpiece, the first silicon based dielectric layer comprising nitrogen and depositing in-situ a second silicon based dielectric layer on the first silicon based dielectric layer, the second dielectric layer comprising oxygen.

In accordance with an embodiment of the present invention, a method for manufacturing a layer stack comprises placing a workpiece in a process chamber. The method further comprising providing a first set of process gases for depositing a $SiO_xN_y$ layer and without interrupting a plasma power, changing the first set of process gases to a second set of process gases thereby forming a $SiO_x$ layer on the $SiO_xN_y$ layer.

In accordance with an embodiment of the present invention, a method for manufacturing a layer stack comprises placing a workpiece in a process chamber. The method further comprises turning on a first set of process gases for depositing a $SiO_xN_y$ layer, plasma-cleaning the workpiece and depositing a dielectric layer on the $SiO_xN_y$ layer.

In accordance with an embodiment of the present invention, a semiconductor device comprises a workpiece, a silicon oxynitride layer ($SiO_xN_y$) disposed on the workpiece and a silicon oxide layer ($SiO_x$) disposed on the silicon oxynitride layer. The workpiece further comprises a transition layer between the silicon oxynitride layer and the silicon oxide layer, wherein the transition layer comprises silicon, oxygen and nitrogen, wherein a concentration of nitrogen in the silicon oxynitride layer is different than a concentration of nitrogen in the transition layer. The stoichiometry of the transition layer may be different than the oxynitride and oxide layer.

BRIEF DESCRIPTION OF THE DRAWINGS

For a more complete understanding of the present invention, and the advantages thereof, reference is now made to the following descriptions taken in conjunction with the accompanying drawings, in which:

FIGS. 1a-1c show interface bonds between an silicon oxynitride layer and silicon oxide layer;

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to embodiments in a specific context, namely a passivation layer or passivation layer stack. The invention may also be applied, however, to other layers or layer stacks.

A problem with the conventional passivation layer of a semiconductor device is that blisters may form between the silicon oxynitride and the silicon oxide. FIG. 1a shows an interface 130 between a silicon oxynitride layer 110 and a silicon oxide layer 120. The interface 130 shows a number of bonds 140 after the deposition of the silicon oxide layer 120 on the silicon oxynitride layer 110. Humidity such as water ($H_2O$) may diffuse through the silicon oxide layer 120 and may reduce the number of bonds 140 across the interface 130 (shown in FIG. 1b). Blisters 150 may form at the interface 130 reducing the number of bonds 140 even more thereby further weakening the interface 130 (shown in FIG. 1c).

Embodiments of the present invention may provide a silicon oxynitride/silicon oxide layer stack with a strong interface bond. Embodiments of the present invention provide in-situ deposition methods to form the silicon oxynitride/silicon oxide layer stack. Embodiments of the present invention provide a deposition method to form the silicon oxynitride/silicon oxide layer stack without turning off the plasma power. Other embodiments provide a cleaning step between the deposition of the silicon oxynitride and the silicon oxide.

An advantage is that blister formation at the interface between silicon oxynitride and silicon oxide is avoided or substantially reduced.

Figure 2:
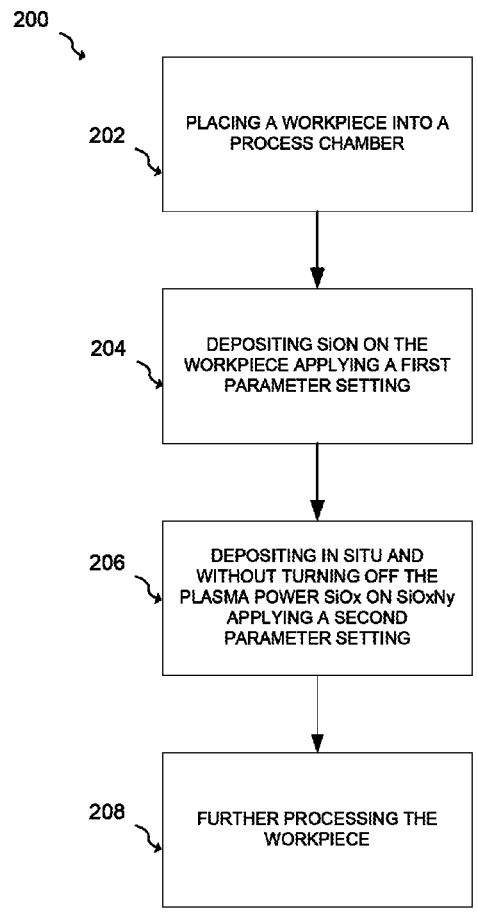
FIG. 2 shows an embodiment of a flow chart of an in-situ process depositing silicon oxynitride and silicon oxide.

FIG. 2 shows a flow chart 200 of an embodiment of a method to manufacture a semiconductor device.

In a first step 202 a workpiece is placed into a process chamber. The workpiece comprises a substrate. The substrate may be a semiconductor substrate such as silicon or germanium, or a compound substrate such as SiGe, GaAs, InP, GaN or SiC. Alternatively, the substrate comprises other materials. The substrate may be doped or undoped and may comprise one or more wells. The semiconductor substrate may be a single crystal silicon or a silicon-on insulator (SOI). One or more interconnect metallization layers connected through vias may be arranged on the substrate. The interconnect metallization layers comprise metal lines in a low-k dielectric material or silicon oxide.

The workpiece may comprise a discrete device such as a single semiconductor device or an integrated circuit (IC). For example, the workpiece may comprise a semiconductor device such as a MOSFET or a power semiconductor device such as a bipolar transistor, an insulated gate bipolar transistor (IGBT), a power MOSFET, a thyristor or a diode. Alternatively, the workpiece may be a resistor, a protective device, a capacitor, a sensor or a detector, for example. The workpiece may be a system on chip (SoC).

In one embodiment the plasma chamber comprises a chemical vapor deposition (CVD) process chamber. For example, the plasma chamber may comprise a plasma enhanced chemical vapor deposition chamber (PE-CVD) or an atmospheric pressure chemical vapor deposition chamber. CVD provides highly conformal and high quality layers at fast processing times. CVD may coat substrates with regular or irregular shapes. In one embodiment the CVD technique delivers gaseous reactants (precursors) to the surface of a workpiece or substrate where chemical reactions take place under temperature and pressure conditions that are favorable to the thermodynamics of the desired reaction.

The workpiece is then passivated. In step 204 silicon oxynitride $SiO_xN_y$ ($SiO_xN_y$ may include $SiO_xN_yH_z$) is deposited on the workpiece. For example, the silicon oxynitride $SiO_xN_y$ is deposited on the top layer of the interconnect metallization layers. A first parameter setting for the deposition of silicon oxynitride may comprise: Silane ($SiH_4$) [range 20 sccm-1000 sccm], $NH_3$ [range 20 sccm-1000 sccm], $N_2O$ [range 20 sccm-1000 sccm], $N_2$ [range 0-10000 sccm] and an inert gas (e.g., Ar, He) [0.1 sccm-16000 sccm]. The pressure may be set between about 1 Torr and about 10 Torr. The plasma power may be set below about 1000 W at a frequency of 13.56 MHz. The process gases are turned on and supplied to the process chamber.

In step 206 silicon oxide $SiO_x$ ($SiO_x$ may include $SiO_xH_y$) is deposited on the workpiece. For example, the silicon oxide $SiO_x$ is deposited directly on the silicon oxynitride $SiO_xN_y$. The silicon oxide $SiO_x$ is deposited on the silicon oxynitride $SiO_xN_y$ in an in-situ process. The first parameter setting is changed to a second parameter setting without removing the workpiece from the process chamber. Moreover, the first parameter setting is changed to a second parameter setting without turning off the plasma power.

In one embodiment some of the first process gases are turned off while others remain on. Moreover, the remaining parameter set may be changed to an oxide mode. The second parameter setting of the process chamber may comprise: Silane $SiH_4$ [range 20 sccm-1000 sccm], $N_2O$ [range 20 sccm-5000 sccm] and an inert gas (e.g., Ar, He) [0.1 sccm-16000 sccm]. The pressure may be set between about 1 Torr and about 10 Torr. The plasma power may be set below about 700 W at a frequency of 13.56 MHz. In one embodiment the pressure is changed, e.g., lowered in the above mentioned range.

When switching from the first parameter set for silicon oxynitride to the second parameter set for silicon oxide residual gases are still available in the process chamber. The residual gases together with the oxide process gases, produce a transition layer or a transition region between the silicon oxynitride layer and the silicon oxide layer.

The transition layer may comprise the same chemical components as the silicon oxynitride layer, however, in a different ratio or stoichiometry.

The transition layer/region may comprise a silicon oxynitride type layer at the bottom of the transition layer and a silicon oxide type layer at the top surface of the transition layer. The nitrogen content of the transition layer may change from the bottom surface to the top surface. In one embodiment, the nitrogen content may gradually change from the bottom surface having a relative high content of nitrogen to the top surface having a relative low content of nitrogen.

In one embodiment, the transition layer is a thin layer. For example, the transition layer may be about 3 nm to about 40 nm thick. Alternatively, the transition layer may be about 10 nm to about 20 nm thick. The silicon oxynitride layer may be about 100 nm to about 1000 nm thick and the silicon oxide layer may be about 100 nm to about 2000 nm thick.

In step 208 the workpiece is further processed. For example, a photoresist may be disposed on the passivation layer (silicon oxynitride/silicon oxide layer stack), structured and developed in order to structure and define bond pads for the component or semiconductor device. The workpiece may be further processed in the same process chamber or in a different process chamber.

Figure 3A:
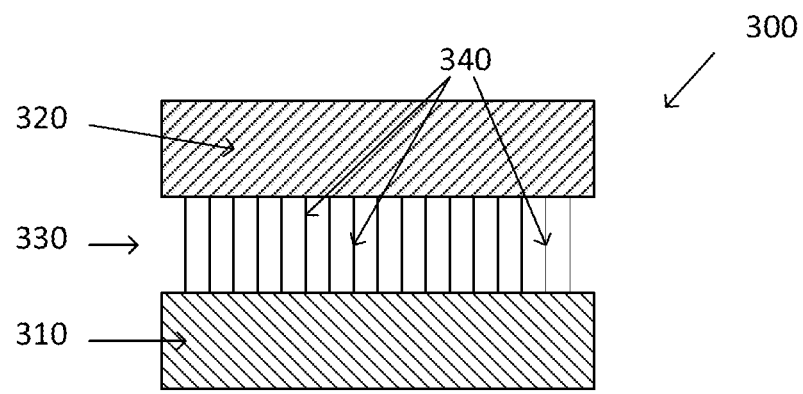
FIG. 3a shows an embodiment of an interface bond between silicon oxynitride and silicon oxide.

FIG. 3*a* shows a passivation layer stack 300 comprising a silicon oxynitride $SiO_xN_y$ 310 and a silicon oxide $SiO_x$ 320 formed according to the method of FIG. 2. The interface 330 between the silicon oxynitride layer $SiO_xN_y$ 310 and the silicon oxide layer $SiO_x$ 320 comprises a very high number of bonds 340. The high number of bonds 340 provides a strong interface 330. Blisters may not form at the interface 330. Due to the number of bonds being very high the strength of the interface is very high. If the number of bonds is reduced, e.g., by humidity, the reduced number of bonds will still be high to provide a strong interface. For example, the workpiece with such an interface may pass a humidity test for automotive specifications.

Figure 3B:
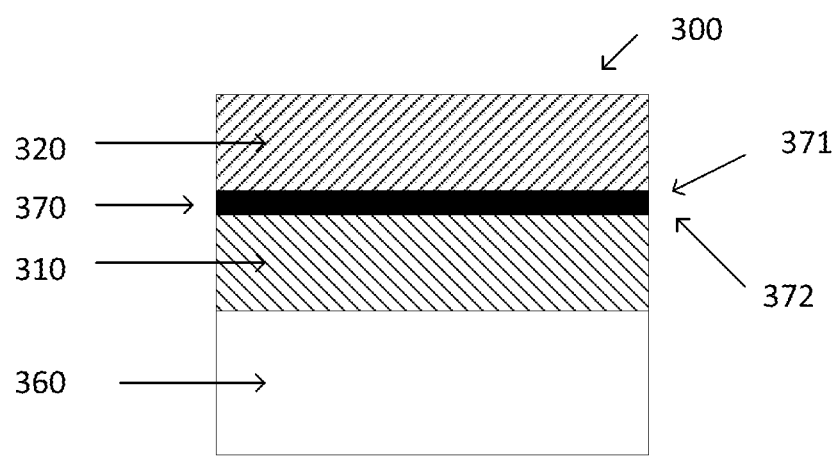
FIG. 3b shows an embodiment of a layer stack comprising silicon oxynitride and silicon oxide.

FIG. 3*b* shows a component or a semiconductor device comprising the passivation 300 layer stack on a workpiece 360. The passivation layer stack 300 comprises the transition layer 370. The transition layer 370 may be similar to the silicon oxide layer 320 at the upper portion 371 of the transition layer 370 and may be similar to the silicon oxynitride layer 310 at the bottom portion 372 of the transition layer 370. The nitrogen content of the transition layer 370 may change from the bottom surface to the top surface. In one embodiment, the nitrogen content gradually decreases from the bottom surface to the top surface.

Figure 4:
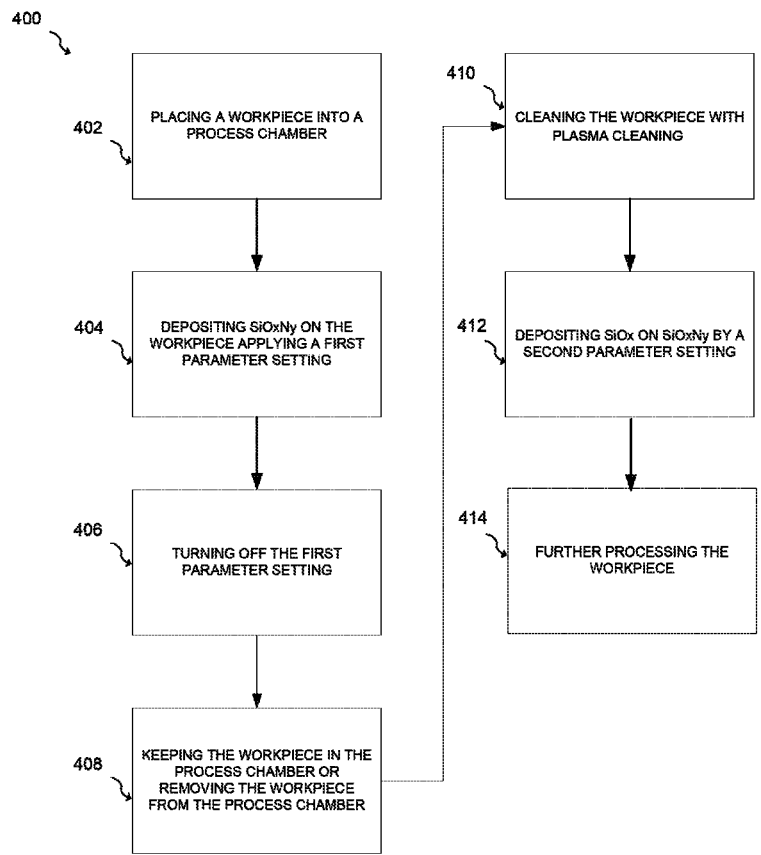
FIG. 4 shows an embodiment of a flow chart of a deposition process depositing silicon oxynitride and silicon oxide.

FIG. 4 shows an embodiment of a flow chart 400 for forming a passivation layer comprising silicon oxynitride and silicon oxide.

In a first step 402 a workpiece is placed into a process chamber. The workpiece comprises a substrate. The substrate may be a semiconductor substrate such as silicon or germanium, or a compound substrate such as SiGe, GaAs, InP, GaN or SiC. Alternatively, the substrate comprises other materials. The substrate may be doped or undoped and may comprise one or more wells. The semiconductor substrate may be a single crystal silicon or a silicon-on insulator (SOI). One or more interconnect metallization layers connected through vias may be arranged on the substrate. The interconnect metallization layers comprise metal lines in a low-k dielectric material or silicon oxide.

The workpiece may comprise a discrete device such as a single semiconductor device or an integrated circuit (IC). For example, the workpiece may comprise a semiconductor device such as a MOSFET or a power semiconductor device such as a bipolar transistor, an insulated gate bipolar transistor (IGBT), a power MOSFET, a thyristor or a diode. Alternatively, the workpiece may be a resistor, a protective device, a capacitor, a sensor or a detector, for example. The workpiece may be a system on chip (SoC).

The workpiece is then passivated. In step 404 silicon oxynitride $SiO_xN_y$ ($SiO_xN_y$ may comprise $SiO_xN_yH_z$) is deposited on the workpiece. For example, the silicon oxynitride $SiO_xN_y$ is deposited on the top layer of the interconnect metallization layers. A first parameter setting for the deposition of silicon oxynitride may comprise: Silane ($SiH_4$) [range 20-1000 sccm], $NH_3$ [range 20-1000 sccm], $N_2O$ [range 20-1000 sccm], $N_2$ [range 0-10000 sccm] and an inert gas (e.g., Ar, He) [0.1-16000 sccm]. The pressure may be set between about 1 Torr and about 10 Torr. The plasma power may be set below about 1000 W at a frequency of 13.56 MHz. The process gases are turned on and supplied to the process chamber In step 406 the first parameter setting is deactivated. For example, the plasma power is turned off and the process gases for silicon oxynitride are also turned off. In step 408 the workpiece is kept in the process chamber or removed from the process chamber and later placed in the same or a different process chamber. In step 410 the workpiece is cleaned. For example, the workpiece is cleaned in a plasma cleaning step. In one embodiment the plasma cleaning comprises nitrous oxide ($N_2O$). The process gases for cleaning may be $N_2O$ [range 20 sccm-5000 sccm] and an inert gas (e.g., Ar, He) [0.1 sccm-16000 sccm]; power 100 W-1.5 kW, pressure: 1 torr-10 torr, and a frequency of 13.56 MHz. FIG. 6 shows an embodiment of the layer stack of FIG. 5 showing a last layer 511 of the $SiO_xN_y$ layer 510 before the plasma cleaning step 410 in FIG. 4.

After the cleaning, in step 412, silicon oxide $SiO_x$ ($SiO_x$ may comprise $SiO_xH_y$) is deposited on the workpiece. For example, the silicon oxide $SiO_x$ is disposed directly on the silicon oxynitride $SiO_xN_y$. A second parameter setting is applied to deposit the silicon oxide $SiO_x$. The second parameter setting is different than the first parameter setting.

In one embodiment some of the first process gases are turned off while others remain on. Moreover, the remaining parameter set may be changed to an oxide mode. The second parameter setting of the process chamber may comprise: Silane $SiH_4$ [range 20 sccm-1000 sccm], $N_2O$ [range 20 sccm-5000 sccm] and an inert gas (e.g., Ar, He) [0.1 sccm-16000 sccm]. The pressure may be set between about 1 Torr and about 10 Torr. The plasma power may be set below about 700 W at a frequency of 13.56 MHz. In one embodiment the pressure is changed, e.g., lowered in the above mentioned range.

Figure 5:
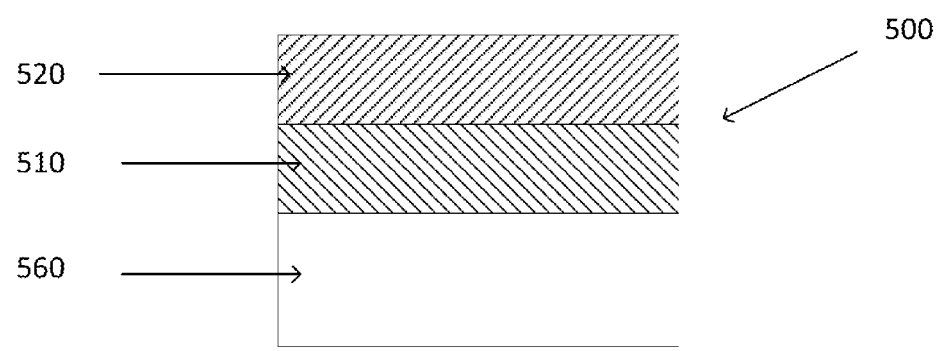
FIG. 5 shows an embodiment of a layer stack comprising silicon oxynitride and silicon oxide.
Figure 6:
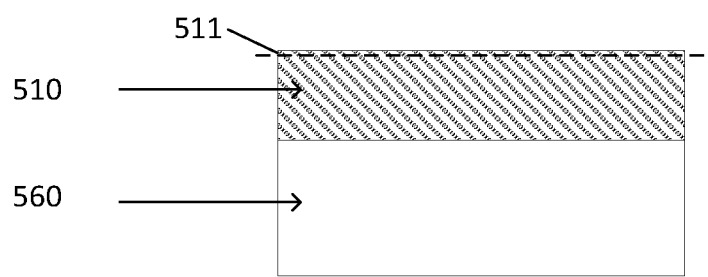
FIG. 6 shows an embodiment of the layer stack of FIG. 5 during fabrication before the plasma cleaning step 410 in FIG. 4.

FIG. 5 shows a component or a semiconductor device comprising a passivation layer stack 500 on a workpiece 560. The passivation layer stack 500 comprises the $SiO_x$ layer 520 is directly disposed on the $SiO_xN_y$ layer 510. The silicon oxynitride layer 510 may be about 100 to about 1000 nm thick and the silicon oxide layer 520 may be about 100 to about 2000 nm thick. Depositing $SiO_x$ on the $SiO_xN_y$ layer after the cleaning step does not form a transition layer or a transition region between the silicon oxide layer 510 and the silicon oxynitride layer 520.

In step 414 the workpiece is further processed. For example, a photoresist may be disposed on the passivation layer (silicon oxynitride/silicon oxide layer stack), structured and developed in order to structure and define bond pads for the component or semiconductor device. The workpiece may be further processed in the same process chamber or in a different process chamber.

Although the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for manufacturing a layer stack, the method comprising:
    placing a workpiece in a plasma process chamber;
    turning on a first set of process gases and depositing a silicon oxynitride ($SiO_xN_y$) layer over the workpiece using the first set of process gases, the silicon oxynitride layer having an exposed top surface comprising a last layer of the silicon oxynitride layer deposited during the depositing, wherein the last layer of the silicon oxynitride that was deposited comprises less nitrogen content than a remaining underlying layer of the silicon oxynitride;
    in the plasma process chamber, plasma-cleaning the workpiece by exposing the last layer of the silicon oxynitride that was deposited to a $N_2O$ plasma, wherein the plasma-cleaning removes the last layer of the deposited silicon oxynitride; and
    in the plasma process chamber, depositing a dielectric layer on the $SiO_xN_y$ layer after the plasma-cleaning, wherein the deposited dielectric layer directly contacts the $SiO_xN_y$ layer.

2. The method according to claim 1, wherein depositing the dielectric layer comprises depositing a silicon-based layer.

3. The method according to claim 1, wherein depositing the dielectric layer comprises turning on a second set of process gases for depositing a $SiO_x$ layer.

4. The method according to claim 3, wherein the second set of process gases comprises $SiH_4$, $N_2O$, and a first inert gas.

5. The method according to claim 4, wherein the first set of process gases comprises $SiH_4$, $N_2O$, $NH_3$ and $N_2$.

6. The method according to claim 5, wherein using the $N_2O$ plasma comprises applying the $N_2O$ plasma including a second inert gas.

7. The method of claim 1, wherein the workpiece is not removed from the plasma process chamber between the depositing of the $SiO_xN_y$ layer and the plasma-cleaning and between the plasma-cleaning and the depositing of the dielectric layer.

8. A method for manufacturing a layer stack, the method comprising:
    in a plasma process chamber, depositing a silicon oxynitride ($SiO_xN_y$) layer over a workpiece by turning on a first set of process gases to form a deposited silicon oxynitride layer, the deposited silicon oxynitride layer having a top surface after the depositing, wherein the top surface is a top surface of a last layer that was deposited in the depositing;

turning off the first set of process gases after the depositing;

in the plasma process chamber, plasma-cleaning the deposited $SiO_xN_y$ layer by exposing the top surface of the deposited silicon oxynitride layer to a plasma comprising $N_2O$; and in the plasma process chamber, directly depositing a silicon oxide layer over the $SiO_xN_y$ layer by turning on a second set of process gases, wherein a composition of the second set of process gases is different from a composition of the first set of process gases, the silicon oxide layer contacting the $SiO_xN_y$ layer, wherein the workpiece is not removed from the plasma process chamber between the turning off the first set of process gases and the plasma-cleaning.

9. The method of claim 8, further comprising turning off plasma power after depositing the $SiO_xN_y$ layer and before plasma-cleaning the deposited $SiO_xN_y$ layer, wherein the deposition of the $SiO_xN_y$ layer is performed when the plasma power is turned on.

10. The method of claim 8, wherein turning on the first set of process gases comprises supplying $SiH_4$, $N_2O$, $NH_3$ and $N_2$ to the plasma process chamber.

11. The method of claim 8, wherein the plasma comprising $N_2O$ includes the $N_2O$ and a first inert gas.

12. The method of claim 8, wherein turning on the second set of process gases comprises supplying $SiH_4$, $N_2O$, and a second inert gas to the plasma process chamber.

13. A method for manufacturing a layer stack, the method comprising:

placing a workpiece in a plasma process chamber;

turning on a first set of process gases and depositing a silicon oxynitride ($SiO_xN_y$) layer over the workpiece using $NH_3$, the silicon oxynitride layer having an exposed top surface comprising a last layer of the silicon oxynitride layer deposited during the depositing;

in the plasma process chamber, plasma-cleaning the workpiece by exposing the last layer of the silicon oxynitride that was deposited during the depositing to a $N_2O$ plasma; and in the plasma process chamber, depositing a dielectric layer on the $SiO_xN_y$ layer using $SiH_4$ and $N_2O$ after the plasma-cleaning, wherein the deposited dielectric layer directly contacts the $SiO_xN_y$ layer, wherein the workpiece is not removed from the plasma process chamber between the depositing and the plasma-cleaning and between the plasma-cleaning and the directly depositing.

14. The method of claim 13, further comprising:

turning off the first set of process gases prior to the plasma-cleaning.

15. The method of claim 13, further comprising turning off plasma power after depositing the $SiO_xN_y$ layer and before plasma-cleaning the deposited $SiO_xN_y$ layer, wherein the deposition of the $SiO_xN_y$ layer is performed when the plasma power is turned on.

16. The method of claim 13, wherein turning on the first set of process gases comprises supplying $SiH_4$ to the plasma process chamber.

17. The method of claim 13, wherein the plasma comprising $N_2O$ includes the $N_2O$ and a first inert gas.

18. The method of claim 13, wherein depositing the dielectric layer comprises turning on a second set of process gases, wherein turning on the second set of process gases comprises supplying $SiH_4$, $N_2O$, and a second inert gas to the plasma process chamber.

* * * * *